(12) United States Patent
Kurooka et al.

(10) Patent No.: US 6,333,643 B1
(45) Date of Patent: Dec. 25, 2001

(54) HOTPLUG TOLERANT I/O CIRCUIT

(75) Inventors: Kazuaki Kurooka; Yasuo Moriguchi, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/476,399

(22) Filed: Jan. 3, 2000

(30) Foreign Application Priority Data

Jul. 5, 1999 (JP) .................................................. 11-190630

(51) Int. Cl.[7] .............................................. H03K 19/094
(52) U.S. Cl. .............................. 326/83; 326/82; 326/80; 326/112
(58) Field of Search ............................... 326/81, 112, 80, 326/82, 119, 83

(56) References Cited

U.S. PATENT DOCUMENTS

| | | | |
|---|---|---|---|
| 4,800,303 | * 1/1989 | Graham et al. | 326/72 |
| 5,266,849 | * 11/1993 | Kitahara et al. | 326/62 |
| 5,410,267 | * 4/1995 | Haycock et al. | 326/81 |
| 5,450,025 | * 9/1995 | Shay . | |
| 5,528,447 | * 6/1996 | McManus et al. | 361/91 |
| 5,546,019 | * 8/1996 | Liao | 326/81 |
| 5,990,705 | * 11/1999 | Lim | 326/81 |
| 6,043,681 | * 3/2000 | Lim | 326/81 |

* cited by examiner

Primary Examiner—Michael Tokar
Assistant Examiner—Steven S. Paik
(74) Attorney, Agent, or Firm—Burns, Doane, Swecker & Mathis, LLP

(57) ABSTRACT

A hotplug tolerant I/O circuit, which is incorporated in a first device, includes a voltage generator. In a hotplug mode, in which an input signal higher than the power supply voltage is applied from a second device to the first device while the power supply voltage is not applied to the first device, the voltage generator generates a control voltage from the input signal, and supplies it to a transistor in the hotplug tolerant I/O circuit. This makes it possible to solve a problem of a conventional hotplug tolerant I/O circuit in that the transistors in the I/O circuit can be damaged in the hotplug mode.

13 Claims, 6 Drawing Sheets

HOTPLUG TOLERANT I/O CIRCUIT

BACKGROUND OF THE INVENTION

1. Field of the Invention

The present invention relates to a hotplug tolerant I/O circuit suitable for a device receiving a signal with a voltage higher than its supply voltage, and more particularly to the hotplug tolerant I/O circuit enabling the device to be hot-plugged to a cable transmitting such a signal. Here, the term "hotplug" refers to externally connecting to the device a data signal having a voltage higher than the supply voltage of the device under the condition in which the supply voltage is not supplied to the device.

2. Description of Related Art

Conventionally, such devices that are supplied with a data signal of a voltage higher than their power supply voltage VDD have been widely used. Even when the data signal with a voltage higher than the power supply voltage VDD is supplied from the outside to the devices under the condition in which the power supply voltage VDD is being supplied to the devices, these devices carry out in their I/O circuit such control that protects transistors constituting the I/O circuit from being supplied with an excessive voltage, and prevents current on a data signal cable from flowing into the power supply (VDD and GND) of the I/O circuit.

FIG. 6 is a circuit diagram showing a conventional I/O circuit in a device. In FIG. 6, the reference numeral 60 designates the I/O circuit; 61 designates an I/O transistor circuit in which three transistors MP1, MN1 and MN2 are connected in series; 62 designates a floating gate signal generator; 63 designates a floating well signal generator; and G1–G3 designate a gate circuit.

Next, the operation of the conventional I/O circuit will be described.

The conventional I/O circuit as shown in FIG. 6 is incorporated in a device, and functions as an I/O interface. The I/O circuit is connected to a signal cable of an external device via I/O pins under the condition in which the power supply voltage VDD is being supplied.

In this case, because the power supply voltage VDD is being applied, the I/O transistor circuit 61 is not supplied with an excessive voltage. Thus, the transistors in the I/O transistor circuit 61 are protected from damage, and no current will flow from the data signal cable to the power supply (VDD and GND) of the I/O circuit.

The conventional I/O circuit with the foregoing configuration has the following problems. First, when the signal with the voltage higher than the power supply voltage VDD is supplied from the external device to the device via the signal cable and I/O pins under the condition in which the power supply voltage VDD is not applied to the device, the transistors MP1, MN1 and MN2 constituting the I/O transistor circuit 61 are supplied with an excessive voltage, and are destroyed. This will disable the I/O circuit, and have an adverse effect on the data on the signal cable because of a current flowing from the signal cable to the power supply (VDD and GND) of the I/O circuit.

SUMMARY OF THE INVENTION

The present invention is implemented to solve the foregoing problems. It is therefore an object of the present invention to provide a hotplug tolerant I/O circuit capable of implementing such control that can protect the transistors constituting the I/O circuit from being supplied with an excessive voltage, and prevent a current from flowing from the signal cable to the power supply (VDD and GND) of the I/O circuit, even when a signal of a voltage higher than the power supply voltage VDD is supplied from the external device via the signal cable and I/O pins, under the condition in which the power supply voltage VDD is not supplied to the device.

According to an aspect of the present invention, there is provided a hotplug tolerant I/O circuit incorporated in a first device, the hotplug tolerant I/O circuit comprising: a first voltage generator for generating a first control voltage from an input signal supplied from a second device, when the first device is connected to the second device under a condition in which a power supply voltage is not supplied to the first device; and an I/O circuit transistor section to which the first control voltage generated by the first voltage generator is supplied instead of the power supply voltage.

Here, the first voltage generator may comprise a first transistor connected to an I/O pin receiving the input signal; a diode connected to the first transistor; and a second transistor connected between the diode and the power supply voltage.

The hotplug tolerant I/O circuit may further comprise a second voltage generator for generating a second control voltage from the input signal supplied from the second device, when the first device is to connected to the second device under the condition in which the power supply voltage is not supplied to the first device, wherein the first control voltage may be supplied to one of a plurality of transistors constituting the I/O circuit transistor section, and the second control voltage may be supplied to another transistor constituting the I/O circuit transistor section.

The second voltage generator may comprise a first transistor connected to the I/O pin receiving the input signal; a diode connected to the first transistor; and a second transistor connected between the diode and the power supply voltage.

The first transistor and the second transistor may be a PMOS transistor each.

The first transistor may be an NMOS transistor and the second transistor may be a PMOS transistor.

DETAILED DESCRIPTION OF THE PREFERRED EMBODIMENTS

The invention will now be described with reference to the accompanying drawings.

Embodiment 1

Figure 1:
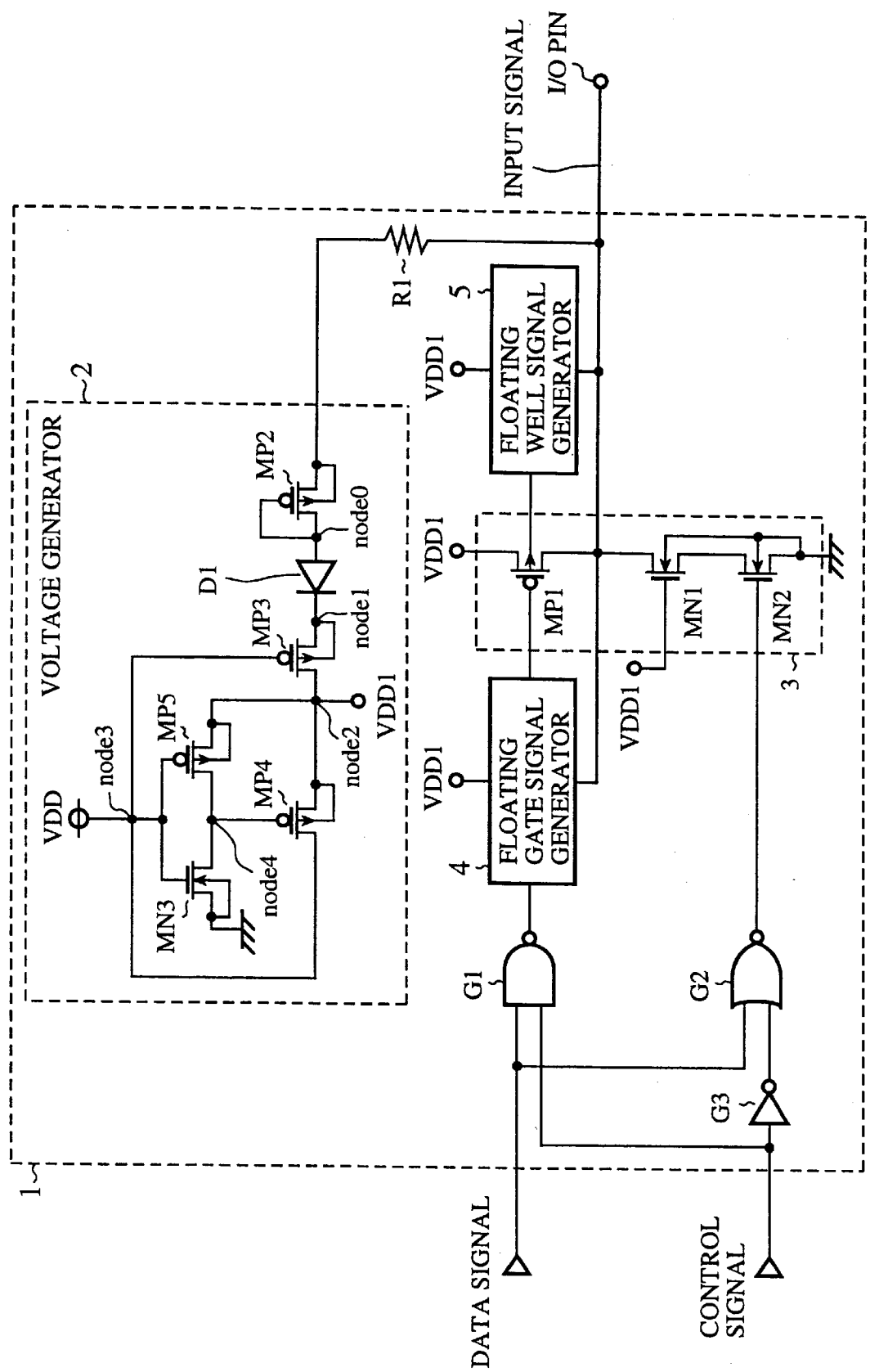
FIG. 1 is a circuit diagram showing an embodiment 1 of the hotplug tolerant I/O circuit in accordance with the present invention.

FIG. 1 is a circuit diagram showing an embodiment 1 of the hotplug tolerant I/O circuit in accordance with the present invention. In FIG. 1, the reference numeral 1 designates a hotplug tolerant I/O circuit that constitutes an I/O interface of a device. The reference numeral 2 designates a voltage generator; 3 designates an I/O circuit transistor section that constitutes a main buffer of the hotplug tolerant I/O circuit. It consists of a PMOS transistor MP1, and NMOS transistors MN1 and MN2. The reference numeral 4 designates a floating gate signal generator; 5 designates a floating well signal generator; and G1–G3 designate a gate circuit.

The voltage generator 2 includes PMOS transistors MP2 and MP3, a diode D1, NMOS transistor MN3 and PMOS transistors MP4 and MP5.

The hotplug tolerant I/O circuit 1 of the present embodiment 1 as shown in FIG. 1 corresponds to the I/O interface of a device like a hard disk drive constituting a computer system.

Next, the operation of the present embodiment 1 will be described.

The hotplug tolerant I/O circuit 1 of the present embodiment 1 as shown in FIG. 1 operates as follows in the hotplug mode, in which an input signal higher than the power supply voltage VDD is supplied from an external device (not shown in FIG. 1) to the I/O circuit 1 via an I/O pin under the condition in which the power supply voltage VDD is not being supplied to the device. The voltage generator 2 generates a control voltage VDD1 corresponding to the power supply voltage VDD from the input signal, and supplies the control voltage VDD1 to the I/O circuit transistor section 3, floating gate signal generator 4 and floating well signal generator 5.

Figure 2:
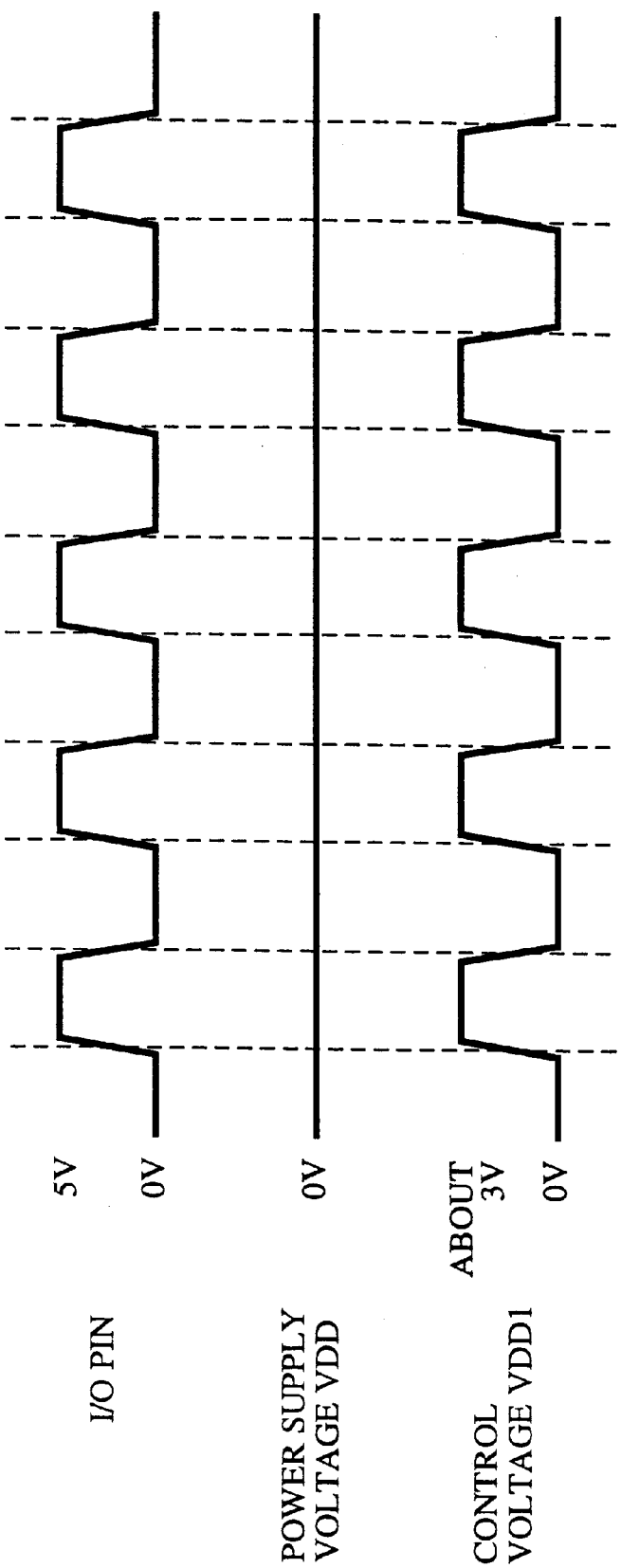
FIG. 2 is a timing chart illustrating a hotplug mode operation of the embodiment 1 of the hotplug tolerant I/O circuit as shown in FIG. 1.

FIG. 2 is a timing chart illustrating the hotplug mode operation of the present embodiment 1 of the hotplug tolerant I/O circuit as shown in FIG. 1.

In the hotplug mode, an input signal with a voltage of about 5V is applied from the external device (not shown) to one of the I/O pins of the device via a signal cable while no power supply voltage VDD (3.3 V, for example) is supplied to the device. In this case, the transistor MP2 in the voltage generator 2 drops the voltage of the input signal, placing the node 0 at about 3.6 V.

In response to this, the potential at the node 1 becomes about 3 V through the diode D1.

Since the transistor MP3 conducts when the power supply voltage VDD is zero (VDD=0), the control voltage VDD1 becomes about 3 V. Likewise, the transistor MP5 conducts, and places the voltage of the node 4 at about 3 V, thereby bringing the transistor MP4 out of conduction.

Thus, even when the power supply voltage VDD is zero (VDD=0), the control voltage VDD1 of about 3 V is generated from the input signal of 5 V fed from the external device to the I/O pin. The control voltage VDD1 is supplied to the I/O circuit transistor section 3, floating gate signal generator 4 and floating well signal generator 5. Accordingly, the I/O circuit transistor section 3 is supplied with the control voltage VDD1 of about the same voltage as the power supply voltage VDD. This makes it possible to protect the I/O circuit transistor section 3 from being destroyed, and prevent the current from flowing from the signal cable to the power supply (VDD and GND) of the I/O circuit.

Subsequently, when the power supply voltage VDD of 3.3 V (VDD=3.3 V) is applied, the transistors MN3 conducts. This will place the node 4 at 0 V, and bring the transistor MP4 into conduction. Accordingly, both the control voltage VDD1 and power supply voltage VDD become about 3.3 V, enabling the normal operation.

When the control voltage VDD1 becomes 3.3 V (VDD1= 3.3 V), the voltage at the node 1 also becomes 3.3 V through the P+ diffusion layer and N well (not shown in FIG. 1) of the transistors MP3. This, however, will not have any adverse effect on the voltage of the input signal supplied to the I/O pin because of the diode D1 connected between the transistors MP2 and MP3, which prevents the node 0 from being placed at 3.3 V.

As described above, the present embodiment 1 is configured such that it incorporates the voltage generator 2 in the I/O circuit of the device to generate the control voltage VDD1, and supplies it to the circuits in the I/O circuit 1 requiring the voltage. This makes it possible in the hotplug mode, in which the input signal with a voltage higher than the power supply voltage VDD is supplied while the power supply voltage VDD is not applied to the device, to protect the transistors in the I/O circuit transistor section 3 from damage, and to prevent the current from flowing from the signal cable to the power supply (VDD and GND) of the I/O circuit, thereby implementing the hotplug tolerant I/O circuit.

Embodiment 2

Figure 3:
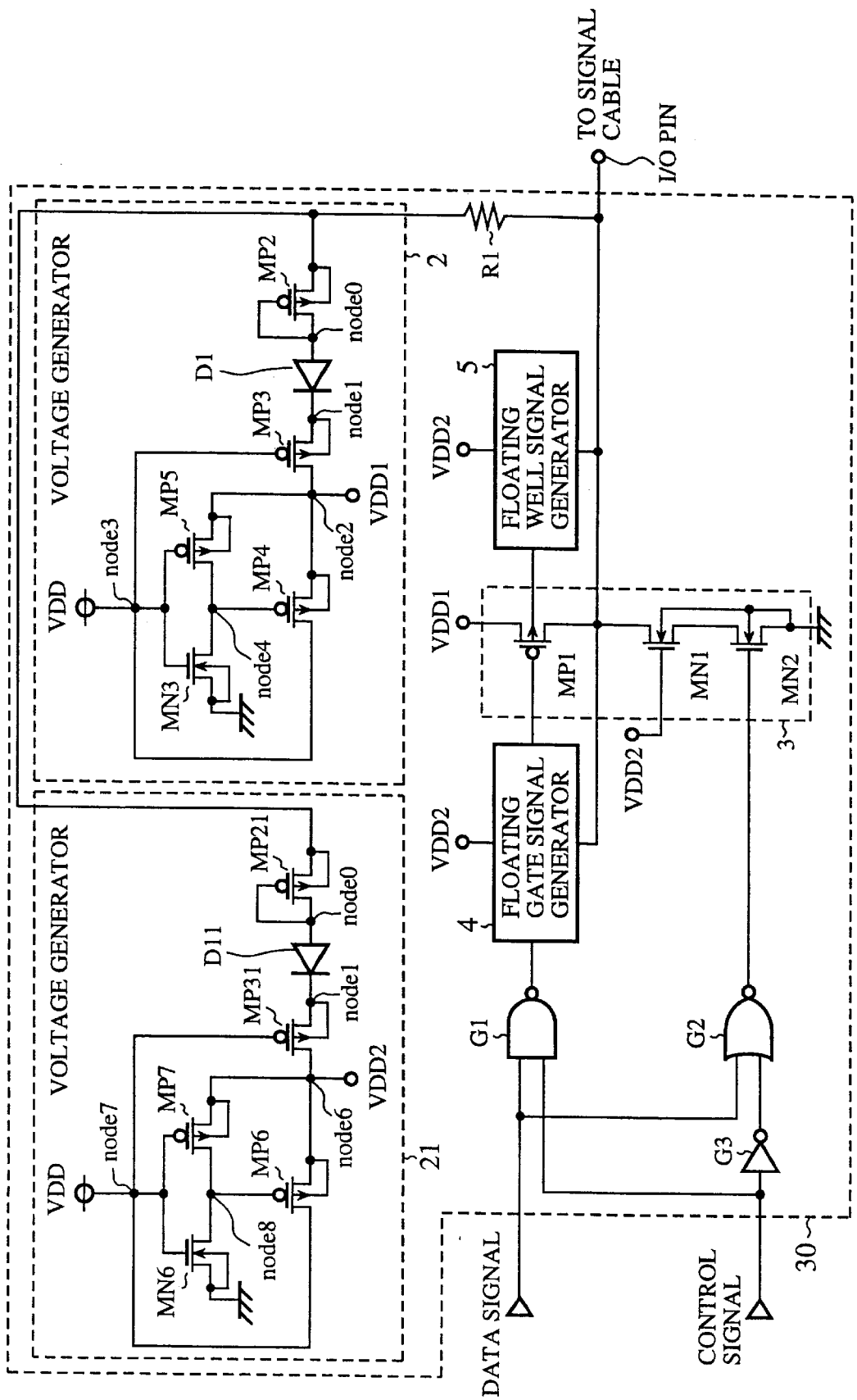
FIG. 3 is a circuit diagram showing an embodiment 2 of the hotplug tolerant I/O circuit in accordance with the present invention.

FIG. 3 is a circuit diagram showing an embodiment 2 of the hotplug tolerant I/O circuit in accordance with the present invention. In FIG. 3, the reference numeral 30 designates a hotplug tolerant I/O circuit constituting an I/O interface of a device. The reference numeral 21 designates a voltage generator; reference symbols MP21 and MP31 each designate a PMOS transistor. Since the remaining components are the same as those shown in FIG. 1, they are designated by the same reference symbols and the description thereof is omitted here.

The hotplug tolerant I/O circuit 30 as shown in FIG. 3 corresponds to an I/O interface of a device like a hard disk drive of a computer system, for example, as the hotplug tolerant I/O circuit 1 of the foregoing embodiment 1.

Next, the operation of the present embodiment 2 will be described.

The hotplug tolerant I/O circuit 30 as shown in FIG. 3 includes besides the voltage generator 2 the second voltage generator 21 connected in parallel with the voltage generator 2. The control voltage VDD1 generated by the voltage generator 2 is supplied to the transistor MP1 in the I/O circuit transistor section 3. On the other hand, the control voltage VDD2 generated by the second voltage generator 21 is supplied to the gate of the transistor MN1 in the I/O circuit transistor section 3, as well as to the floating gate signal generator 4 and floating well signal generator 5.

In the hotplug condition, in which the input signal of a voltage higher than the power supply voltage VDD is supplied from an external device (not shown in FIG. 3) to the I/O circuit 30 in the device via the I/O pin while the power supply voltage VDD is not supplied to the device, the hotplug tolerant I/O circuit 30 of the present embodiment 2 as shown in FIG. 3 operates as follows. The voltage generators 2 and 21 generate the control voltages VDD1 and VDD2 corresponding to the power supply voltage VDD from the voltage of the input signal, and supply the control voltages VDD1 and VDD2 to the I/O circuit transistor section 3, floating gate signal generator 4 and floating well signal generator 5.

In the normal driving mode, however, every time the transistor MP1 in the I/O circuit transistor section 3 constituting the main buffer turns on, the control voltage VDD1 drops. The effect of the voltage drop will transfer to the transistors MN1 and MN2 connected to the control voltage VDD1 via the transistor MP1.

To avoid the effect of the voltage drop of the control voltage VDD1, that is, to prevent the effect of the voltage fluctuations in the transistor MP1 from rippling to the remaining transistors, the hotplug tolerant I/O circuit 30 of the present embodiment 2 installs the two voltage generators 2 and 21.

The control voltage VDD1 generated by the voltage generator 2 is supplied to the transistor MP1 in the I/O circuit transistor section 3, while the control voltage VDD2 generated by the voltage generator 21 is supplied to the transistor MN1 in the I/O circuit transistor section 3, and to the floating gate signal generator 4 and floating well signal generator 5.

Figure 4:
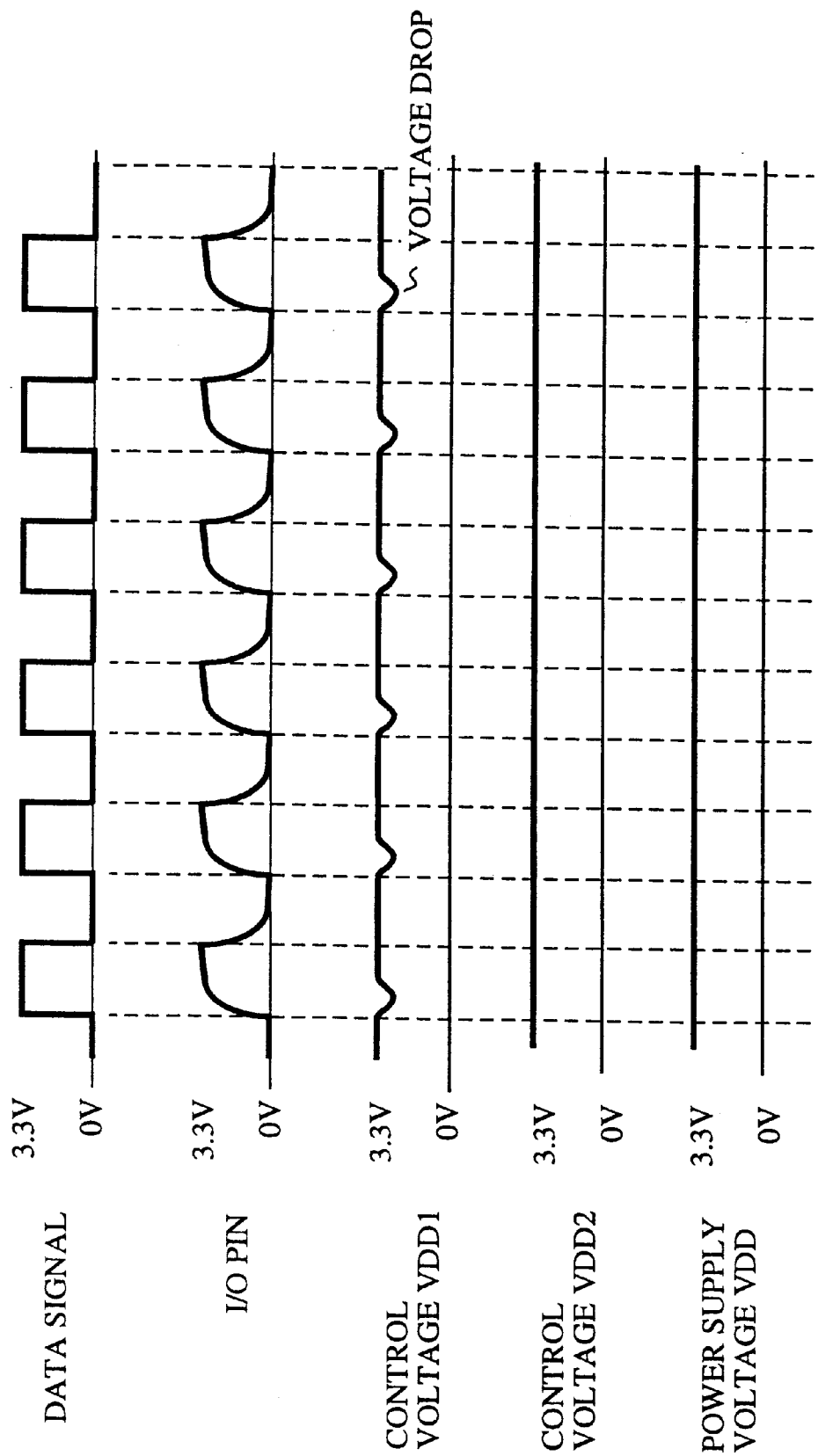
FIG. 4 is a timing chart illustrating a normal mode operation of the embodiment 2 of the hotplug tolerant I/O circuit as shown in FIG. 3.

FIG. 4 is a timing chart illustrating the normal mode operation of the present embodiment 2 of the hotplug tolerant I/O circuit as shown in FIG. 3. As illustrated in FIG. 4, the effect of the voltage drop of the control voltage VDD1 does not appear in the control voltage VDD2.

Thus, the present embodiment 2 can prevent the voltage fluctuations in the control voltage VDD1 during the normal driving operation from rippling to the remaining circuit in the hotplug tolerant I/O circuit 30. Since the remaining operation is the same as that of the foregoing embodiment 1, the description thereof is omitted here.

As described above, the present embodiment 2 is configured such that it incorporates the two voltage generators 2 and 21, and supplies the control voltage VDD1 generated by the first voltage generator 2 to the transistor MP1 in the I/O circuit transistor section 3, and the control voltage VDD2 generated by the second voltage generator 21 to the remaining components. This offers an advantage, besides that of the foregoing embodiment 1, of being able to avoid the adverse effect due the voltage drop in the transistor MP1.

Embodiment 3

Figure 5:
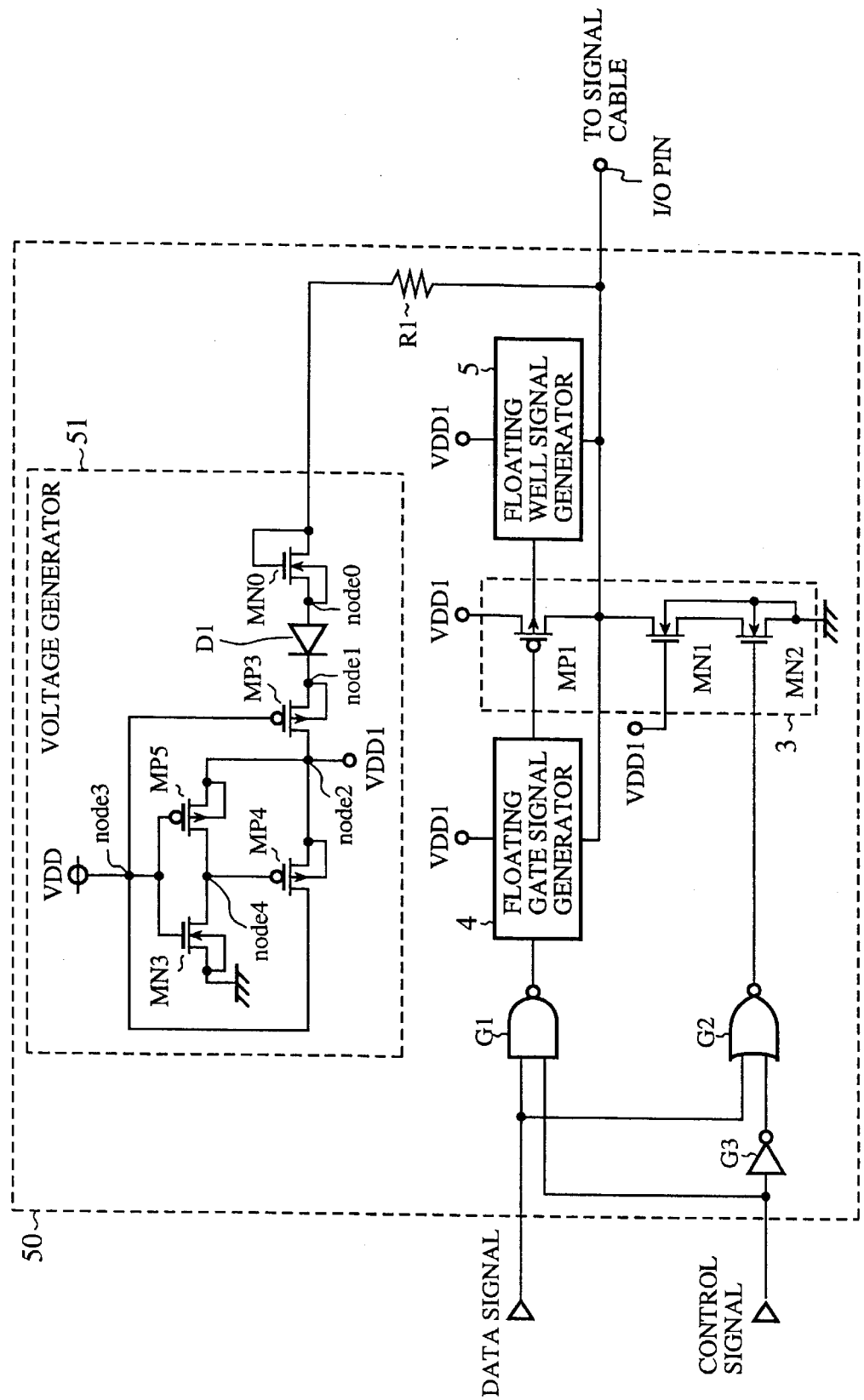
FIG. 5 is a circuit diagram showing an embodiment 3 of the hotplug tolerant I/O circuit in accordance with the present invention.
Figure 6:
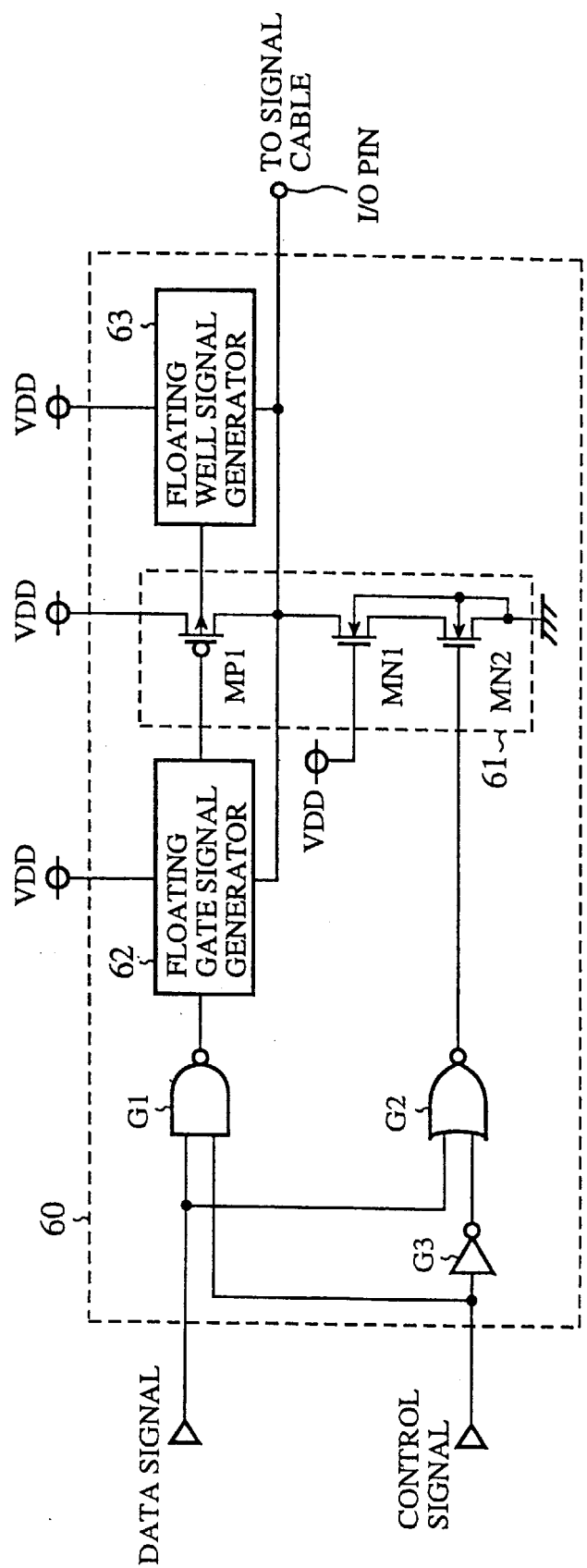
FIG. 6 is a circuit diagram showing a conventional I/O circuit.

FIG. 5 is a circuit diagram showing an embodiment 3 of the hotplug tolerant I/O circuit in accordance with the present invention. In FIG. 5, the reference numeral 50 designates a hotplug tolerant I/O circuit constituting an I/O interface of a device. The reference numeral 51 designates a voltage generator; and MNO designates an N-channel MOS transistor. Since the remaining components are the same as those of the foregoing embodiment 1, they are designated by the same reference symbols, and the description thereof is omitted here.

The hotplug tolerant I/O circuit 50 of the present embodiment 3 as shown in FIG. 5 corresponds to the I/O interface of a device like a hard disk drive constituting a computer system as the hotplug tolerant I/O circuits of the foregoing embodiments 1 and 2.

Next, the operation of the present embodiment 3 will be described.

The hotplug tolerant I/O circuit 1 of the foregoing embodiment 1 as shown in FIG. 1 employs the p-channel MOS transistor MP2 between the I/O pin and the diode D1 in the voltage generator 2.

In contrast with this, the hotplug tolerant I/O circuit 50 of the present embodiment 3 employs the n-channel MOS transistor MNO between the I/O pin and the diode D1 in the voltage generator 51.

Thus employing the NMOS transistor MNO instead of the PMOS transistor MP2 offers the same effect.

As described above, the present embodiment 3 is configured such that it employs the NMOS transistor MNO as the transistor connected to the I/O pin via a resistor Rl in the voltage generator 50. This makes it possible to achieve the same effect as the foregoing embodiment 1. Incidentally, although the foregoing embodiment 2 incorporates the two voltage generators 2 and 21, the two voltage generators can each be configured using the NMOS transistor MNO as the transistor to be connected to the I/O pin via the resistor R1, offering the same effect.

What is claimed is:

1. A hotplug tolerant I/O circuit incorporated in a first device, said hotplug tolerant I/O circuit comprising:

a first voltage generator for generating a first control voltage from an input signal supplied from a second device, when the first device is connected to the second device under a condition in which a power supply voltage is not supplied to the first device; and an I/O circuit transistor section to which the first control voltage generated by said first voltage generator is supplied instead of the power supply voltage.

2. The hotplug tolerant I/O circuit according to claim 1, wherein said first voltage generator comprises a first transistor connected to an I/O pin receiving the input signal; a diode connected to the first transistor; and a second transistor connected between the diode and the power supply voltage.

3. The hotplug tolerant I/O circuit according to claim 2, wherein the first transistor and the second transistor are a PMOS transistor each.

4. The hotplug tolerant I/O circuit according to claim 2, wherein the first transistor is an NMOS transistor and the second transistor is a PMOS transistor.

5. The hotplug tolerant I/O circuit according to claim 1, further comprising a second voltage generator for generating a second control voltage from the input signal supplied from the second device, when the first device is to connected to the second device under the condition in which the power supply voltage is not supplied to the first device, wherein the first control voltage is supplied to one of a plurality of transistors constituting said I/O circuit transistor section, and the second control voltage is supplied to another transistor constituting the I/O circuit transistor section.

6. The hotplug tolerant I/O circuit according to claim 5, wherein said second voltage generator comprises a first transistor connected to the I/O pin receiving the input signal; a diode connected to the first transistor; and a second transistor connected between the diode and the power supply voltage.

7. The hotplug tolerant I/O circuit according to claim 6, wherein the first transistor and the second transistor are a PMOS transistor each.

8. The hotplug tolerant I/O circuit according to claim 6, wherein the first transistor is an NMOS transistor and the second transistor is a PMOS transistor.

9. The hotplug tolerant I/O circuit according to claim 1, wherein the power supply voltage and the control voltage are electrically separated from each other in the first voltage generator by a transistor.

10. The hotplug tolerant I/O circuit according to claim 9, wherein said transistor acts as a switch to switch output of the first voltage generator between the control voltage and the power supply voltage.

11. A hotplug tolerant I/O circuit incorporated in a first device, said hotplug tolerant I/O circuit comprising:

a first voltage generator for generating a first control voltage from an input signal supplied from a second device, when the first device is connected to the second device under a condition in which a power supply voltage is not supplied to the first device; and an I/O circuit transistor section inputting the first control voltage generated by said first voltage generator instead of the power supply voltage, the first control voltage being input as a source voltage.

12. The hotplug tolerant I/O circuit according to claim 11, wherein the power supply voltage and the control voltage are electrically separated from each other in the first voltage generator by a transistor.

13. The hotplug tolerant I/O circuit according to claim 12, wherein said transistor acts as a switch to switch output of the first voltage generator between the control voltage and the power supply voltage.

* * * * *